US010892733B2

(12) United States Patent
Doll et al.

(10) Patent No.: US 10,892,733 B2
(45) Date of Patent: Jan. 12, 2021

(54) PIEZO-ACTUATED MEMS RESONATOR WITH SURFACE ELECTRODES

(71) Applicant: SiTime Coporation, Santa Clara, CA (US)

(72) Inventors: Joseph C. Doll, Mountain View, CA (US); Paul M. Hagelin, Saratoga, CA (US); Ginel C. Hill, Sunnyvale, CA (US); Nicholas Miller, Sunnyvale, CA (US); Charles I. Grosjean, Los Gatos, CA (US)

(73) Assignee: SITIME CORPORATION, Santa Clara, CA (US)

( * ) Notice: Subject to any disclaimer, the term of this patent is extended or adjusted under 35 U.S.C. 154(b) by 365 days.

(21) Appl. No.: 15/947,577

(22) Filed: Apr. 6, 2018

(65) Prior Publication Data

US 2018/0226942 A1 Aug. 9, 2018

Related U.S. Application Data

(62) Division of application No. 15/627,029, filed on Jun. 19, 2017, now Pat. No. 10,263,596, which is a
(Continued)

(51) Int. Cl.
*H01L 41/09* (2006.01)
*H03H 9/02* (2006.01)
(Continued)

(52) U.S. Cl.
CPC ..... *H03H 9/02448* (2013.01); *H01L 41/0478* (2013.01); *H01L 41/253* (2013.01);
(Continued)

(58) Field of Classification Search
CPC .......... H03H 9/02448; H03H 9/02362; H03H 9/2452; H03H 2003/027;
(Continued)

(56) References Cited

U.S. PATENT DOCUMENTS

| 6,325,848 B1 | 12/2001 | Watanabe |
| 7,202,761 B2 | 4/2007 | Lutz et al. |

(Continued)

FOREIGN PATENT DOCUMENTS

| WO | 2005025057 A2 | 3/2005 |
| WO | 2011042597 A1 | 4/2011 |
| WO | 2012110708 A1 | 8/2012 |

OTHER PUBLICATIONS

Bachelet et al., "Structural-energy calculations based on norm-conserving pseudopotentials and localized Gaussian orbitals", Physical Review B, vol. 24, No. 8, pp. 4745-4752, Oct. 1981.
(Continued)

*Primary Examiner* — Thomas M Dougherty

(57) ABSTRACT

A microelectromechanical system (MEMS) resonator includes a degenerately-doped single-crystal silicon layer and a piezoelectric material layer disposed on the degenerately-doped single-crystal silicon layer. An electrically-conductive material layer is disposed on the piezoelectric material layer opposite the degenerately-doped single-crystal silicon layer, and patterned to form first and second electrodes.

25 Claims, 5 Drawing Sheets

Temperature-Dependent Mechanical Stress

Temperature-dependent mechanical stress on resonator (leveraging piezoelectric response of AlN)

Temp-Insensitive Resonator Frequency

Time-Varying Ambient Temp

Related U.S. Application Data division of application No. 14/617,753, filed on Feb. 9, 2015, now Pat. No. 9,705,470.

(60) Provisional application No. 61/937,601, filed on Feb. 9, 2014.

(51) Int. Cl.
| | | |
|---|---|---|
| *H03H 9/24* | (2006.01) | |
| *H01L 41/047* | (2006.01) | |
| *H01L 41/253* | (2013.01) | |
| *H01L 41/29* | (2013.01) | |
| *H01L 41/314* | (2013.01) | |
| *H03H 9/15* | (2006.01) | |
| *H03H 3/02* | (2006.01) | |

(52) U.S. Cl.
CPC .......... *H01L 41/29* (2013.01); *H01L 41/314* (2013.01); *H03H 9/02362* (2013.01); *H03H 9/2452* (2013.01); *H03H 2003/027* (2013.01); *H03H 2009/02307* (2013.01); *H03H 2009/155* (2013.01)

(58) Field of Classification Search
CPC .... H03H 2009/02307; H03H 2009/155; H01L 41/0478; H01L 41/253; H01L 41/29; H01L 41/314
USPC .................................................. 310/311–371
See application file for complete search history.

(56) References Cited

U.S. PATENT DOCUMENTS

| | | | |
|---|---|---|---|
| 7,369,003 B2 | 5/2008 | Hagelin | |
| 7,369,004 B2 | 5/2008 | Partridge et al. | |
| 7,443,258 B2 | 10/2008 | Hagelin | |
| 7,446,619 B2 | 11/2008 | Partridge et al. | |
| 7,446,620 B2 | 11/2008 | Partridge et al. | |
| 7,514,853 B1 | 4/2009 | Howe et al. | |
| 7,545,228 B1 | 6/2009 | Lu et al. | |
| 7,586,239 B1* | 9/2009 | Li ...................... | H03H 3/0072 310/323.02 |
| 7,639,104 B1 | 12/2009 | Quevy et al. | |
| 7,639,105 B2 | 12/2009 | Ayazi et al. | |
| 7,800,282 B2 | 9/2010 | Ayazi et al. | |
| 7,843,284 B2 | 11/2010 | Ayazi et al. | |
| 7,888,843 B2 | 2/2011 | Ayazi et al. | |
| 7,898,158 B1* | 3/2011 | Li ...................... | H03H 9/02275 310/320 |
| 7,924,119 B1 | 4/2011 | Ayazi et al. | |
| 7,939,990 B2 | 5/2011 | Wang et al. | |
| 8,061,013 B2 | 11/2011 | Ayazi et al. | |
| 8,558,643 B2 | 10/2013 | Prunnila et al. | |
| 8,633,635 B1 | 1/2014 | Pan | |
| 8,786,166 B2 | 7/2014 | Jaakkola et al. | |
| 8,916,942 B2 | 12/2014 | Pensala et al. | |
| 9,071,226 B2 | 6/2015 | Jaakkola et al. | |
| 9,705,470 B1* | 7/2017 | Doll ................... | H03H 9/02448 |
| 10,218,333 B2* | 2/2019 | Doll ................... | H03H 9/02448 |
| 10,263,596 B2* | 4/2019 | Doll ................... | H03H 9/02448 |
| 2002/0074897 A1 | 6/2002 | Ma et al. | |
| 2003/0184412 A1 | 10/2003 | Gorrell | |
| 2005/0195050 A1 | 9/2005 | Lutz et al. | |
| 2005/0242904 A1 | 11/2005 | Lutz et al. | |
| 2006/0033594 A1 | 2/2006 | Lutz et al. | |
| 2006/0261703 A1 | 11/2006 | Quevy et al. | |
| 2006/0261915 A1 | 11/2006 | Lutz et al. | |
| 2007/0120625 A1 | 5/2007 | Larson et al. | |
| 2007/0262831 A1 | 11/2007 | Van Beek et al. | |
| 2009/0108959 A1 | 4/2009 | Piazza et al. | |
| 2009/0153258 A1 | 6/2009 | Lutz et al. | |
| 2009/0158566 A1 | 6/2009 | Hagelin et al. | |
| 2010/0060111 A1 | 3/2010 | Ayazi et al. | |
| 2010/0107736 A1 | 5/2010 | Lu et al. | |
| 2010/0127596 A1 | 5/2010 | Ayazi et al. | |
| 2010/0127798 A1 | 5/2010 | Ayazi et al. | |
| 2010/0327701 A1 | 12/2010 | Grannen et al. | |
| 2011/0074247 A1 | 3/2011 | Hohlfeld et al. | |
| 2011/0266925 A1 | 11/2011 | Ruby et al. | |
| 2011/0305120 A1 | 12/2011 | Hessler et al. | |
| 2012/0013412 A1 | 1/2012 | Winkler et al. | |
| 2012/0132003 A1 | 5/2012 | Comi et al. | |
| 2012/0230159 A1 | 9/2012 | Hessler et al. | |
| 2012/0286903 A1 | 11/2012 | Prunnila et al. | |
| 2013/0106246 A1 | 5/2013 | Raieszadeh et al. | |
| 2013/0285676 A1 | 10/2013 | Rahafrooz et al. | |
| 2016/0099702 A1 | 4/2016 | Jaakkola et al. | |
| 2016/0099703 A1 | 4/2016 | Jaakkola et al. | |
| 2016/0099704 A1 | 4/2016 | Jaakkola et al. | |
| 2017/0230030 A1* | 8/2017 | Doll ................... | H03H 9/125 |
| 2017/0288629 A1* | 10/2017 | Bhattacharjee .... | H03H 9/02118 |

OTHER PUBLICATIONS

Bruner et al., "Electronic Effect in the Elastic Constants of Germanium", Physical Review Letters, vol. 7, No. 2, pp. 55-56, Jul. 1961.

Cerdeira et al., "Effect of Carrier Concentration on the Raman Frequencies of Si and Ge", Physical Review B, vol. 5, No. 4, pp. 1440-1454, Feb. 1972.

Csavinszky et al., "Effect of Doping on the Elastic Constants of Silicon", Physical Review, vol. 132, No. 6, pp. 2434-2440 Dec. 1963.

ECN Magazine, "World's First MEMS Real Time Clock," Nov. 29, 2010, 4 pages.

EE Times, "Built-in MEMS resonators beat quartz," Nov. 30, 2010, 3 pages.

Einspruch et al., "Electronic Effect in the Elastic Constant C' of Silicon", Applied Physics Letters, vol. 2, No. 1, pp. 1-3, Jan. 1963.

European Patent Office, International Search Report and Written Opinion of International Searching Authority in International Application No. PCT/US2016/038275, dated Nov. 2, 2016, 19 pages.

Frangi, Attilio et al., "Interface dissipation in piezoelectric MEMS resonators: an experimental and numerical investigation," Sensors, 2013 IEEE, Nov. 3-6, 2013, Baltimore, MD, pp. 1-4, ISSN: 1930-0395.

Hall, "Electronic Effects in the Elastic Constraints of n-Type Silicon", Physical Review, vol. 161, No. 3, pp. 756-761, Sep. 1967.

Hammond et al., "Intertial Transducer Design for Manufacturability and Performance at Motorola," 12th International Conference on Transducers, Solid-State Sensors, Actuators and Microsystems, 2003, Piscataway, NJ, USA, IEEE, Jun. 8, 2003, pp. 85-90, vol. 1.

Hao, Zhili et al., "An analytical study on interfacial dissipation in piezoelectric rectangular block resonators with in-plane longitudinal-mode vibrations," available online Aug. 21, 2015, Elsevier Sensors and Actuators A 163 (2010), pp. 401-409.

Harrison, "Pseudopotential theory of covalent bonding", Physical Review B, vol. 14, No. 2, pp. 702-711, Jul. 1976.

Hoperoft et al., "What is the Young's Modulus of Silicon?", Journal of Microelectromechanical Systems, vol. 19, No. 2, pp. 229-238, Apr. 2010.

Hung, Li-Wen et al., "Capacitive-Piezoelectric Transducers for High-Q Micromechanical AlN Resonators," Journal of Microelectromechanical Systems, vol. 24, No. 2, Apr. 2015, pp. 458-473.

Jaakkola, Antti et al. Experimental Determination of the Temperature Dependency of the Elastic Constants of Degenerately Doped Silicon, 2013 Joint UFFC, EFTF and PFM Symposium, pp. 421-424, IEEE.

Kaajakari, "Silicon as an anisotropic mechanical material—a tutorial", http://www. kaajakarl.net/-ville/research/tutorials/tutorials.shtml, pp. 1-5.

Keyes, "Density of States of Degenerate n-Type Silicon from Elastic Constants", Solid State Communications, vol. 32, No. 2, pp. 179-180; 1979.

Keyes, "Elastic Properties of Diamond-Type Semiconductors", Journal of Applied Physics, vol. 33, No. 11, pp. 3371-3372, Nov. 1962.

(56) References Cited

OTHER PUBLICATIONS

Kim, "Electronic effect on the elastic constant C44 of n-type silicon", J. Appl. Phys., vol. 52, No. 5, pp. 3693-3695, May 1981.

Kourani, Ali et al., "A 76.8 MHz temperature compensated MEMS reference oscillator for wireless handsets," available online Apr. 20, 2015, Elsevier Microelectronics Journal 46 (2015), pp. 496-505.

Lee, Hyung Kyu et al., "Electrostatic Tuning to Achieve Higher Stability Microelectromechanical Composite Resonators," IEEE Journal of Microelectromechanical Systems, vol. 20, No. 6, Dec. 2011, pp. 1355-1365.

Matsuda, Satoru et al., "Correlation Between Propagation Loss and Silicon Dioxide Film Properties for Surface Acoustic Wave Devices," IEEE Transactions on Ultrasonics, Ferroelectrics, and Frequency Control, vol. 60, No. 5, May 2013, pp. 993-997.

McSkimin, "Measurement of Elastic Constants at Low Temperatures by Means of Ultrasonic Waves-Data for Silicon and Germanium Single Crystals, and for Fused Silica", Journal of Applied Physics, vol. 24, No. 8, pp. 988-997, Aug. 1953.

Melamud, Renata et al., "Temperature-Insensitive Composite Micromechanical Resonators," IEEE Journal of Microelectromechanical Systems, vol. 18, No. 6, Dec. 2009, pp. 1409-1419.

Nelson, Andrew et al., A 48 MHz, Hermetic, 0.48 mm2 Chip-Scale Packaged USB3.0 Oscillator Integrating an FBAR Resonator with CMOS Circuitry, 2011 IEEE International Ultrasonics Symposium Proceedings, pp. 1226-1229.

Pan, Wanling et al. "Thin-Film Piezoelectric-On-Substrate Resonators With Q Enhancement and TCF Reduction," Micro Electro Mechanical Systems (MEMS), 2010 IEEE 23rd International Conference, Jan. 24-28, 2010, Wanchai, Hong Kong, pp. 727-730, ISSN: 1084-6999.

Pensala et al., "Temperature Compensation of Silicon MEMS Resonators by Heavy Doping", Ultrasonics Symposium (IUS), 2011 IEEE International, pp. 1952-1955, Oct. 2011.

Popa, Laura C. et al., "2DEG Electrodes for Piezoelectric Transduction of AlGaN/GaN MEMS Resonators," European Frequency and Time Forum & International Frequency Control Symposium (EFTF/IFC), 2013 Joint, Jul. 21-25, 2013, Prague, pp. 922-925, IEEE.

Pourkamali, Siavash; "High Frequency Capacitive Single Crystal Silicon Resonators and Coupled Resonator Systems," Dissertation at Georgia Institute of Technology; Dec. 2006.

Rodriguez et al., "Structural properties of tetrahedrally coordinated crystals from first-principles calculations of pressure and total energies" Physical Review B, vol. 31, No. 8, pp. 5327-5334, Apr. 1985.

Ruby, Rich, "Positioning FBAR Technology in the Frequency and Timing Domain," Frequency Control and the European Frequency and Time Forum (FCS), 2011 Joint Conference of the IEEE International, San Francisco, CA, May 2-5, 2011, pp. 1-10, ISBN 978-1-61284-111-3.

Samarao et al., "Temperature Compensation of Silicon Micromechanical Resonators Via Degenerate Doping," Electron Devices Meeting (IEDM), 2009 IEEE International, IEEE Piscataway, NJ, USA, Dec. 7, 2009, pp. 1-4.

Samarao, et al., Temperature Compensation of Silicon Micromechanical Resonators via Degenerate Doping, IEDM, pp. 789-792, Dec. 2009.

Sanchez-Dehesa et al., "Self-consistent calculation of the internal strain parameter of silicon", Physical Review B, vol. 26, No. 10, pp. 5960-5962, Nov. 1982.

Seitner, Maximilian J. et al., "Damping of metallized bilayer nanomechanical resonators at room temperature," Sep. 22, 2014, University of Konstanz, Department of Physics, 78457 Konstanz, Germany, pp. 1-17.

Smith et al., "Reevaluation of the derivatives of the half order Fermi integrals", J. Appl. Phys., vol. 73, No. 11, pp. 1030-7034, Jun. 1993.

Van Camp et al. "First Principles Calculation of Ground State and Electronic Properties of C and Si", Physica Scripta, vol. 35, pp. 706-709; 1987.

Villanueva, L.G. et al., "Interface Losses in Multimaterial Resonators," MEMS 2014, San Francisco, CA, USA, Jan. 26-30, 2014, pp. 632-635, IEEE.

White, Jr. B.E. et al., "Internal Friction of Subnanometer a-Si02 Films," The American Physical Society, Physical Review Letters, vol. 75, No. 24, Dec. 11, 1995, pp. 4437-4439.

Hsu et al., "Frequency Trimming for MEMS Resonator Oscillators." Discera Inc., Ann Arbor, Michigan whsu@discera.com, IEEE, 2007, pp. 1088-1091.

Hsu et al., "In Situ Localized Annealing for Contamination Resistance and Enhanced Stability in Nickel Micromechanical Resonators," 10th International Conference on Solid-State Sensors and Actuators, Sendai, Japan, Jun. 7-10, 1999, pp. 932-935.

Shahmohammadi, Moshen; Harrington, Brandon P.; Abdolvand, Reza; Zero Temperature Coefficient of Frequency in Extensional-Mode Highly Doped Silicon Micro-Resonators, 1-4, Jul. 19, 2012, 2012 IEEE International Frequency Control Symposium Proceedings.†

\* cited by examiner
† cited by third party

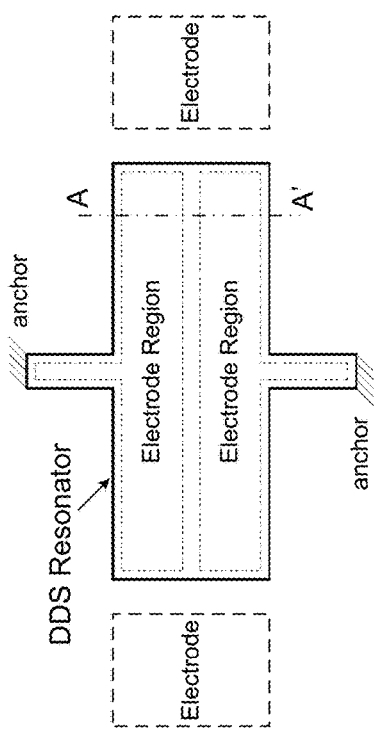
FIG. 1A
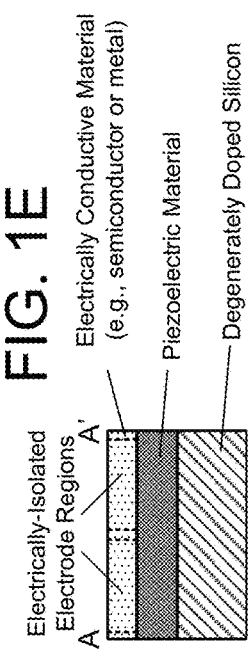
FIG. 1B
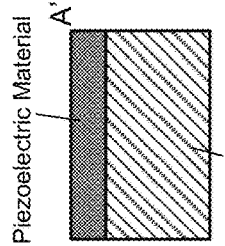
FIG. 1C
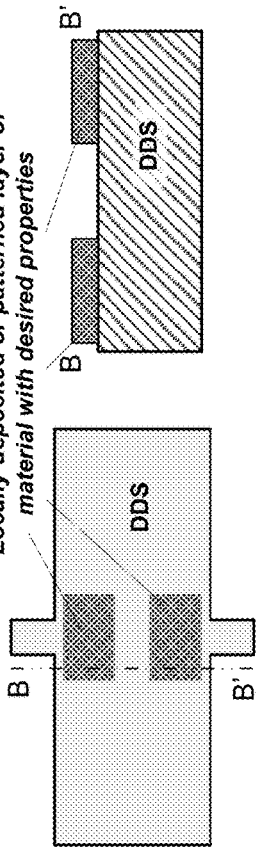
FIG. 1D
FIG. 1E
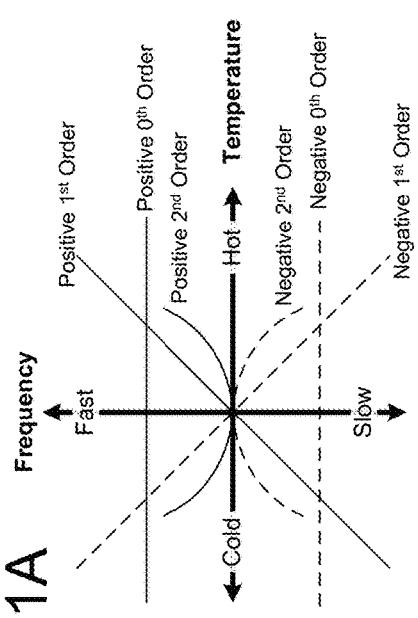
FIG. 1F
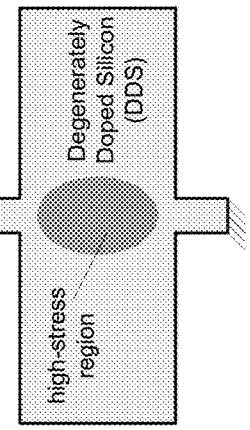
FIG. 1G

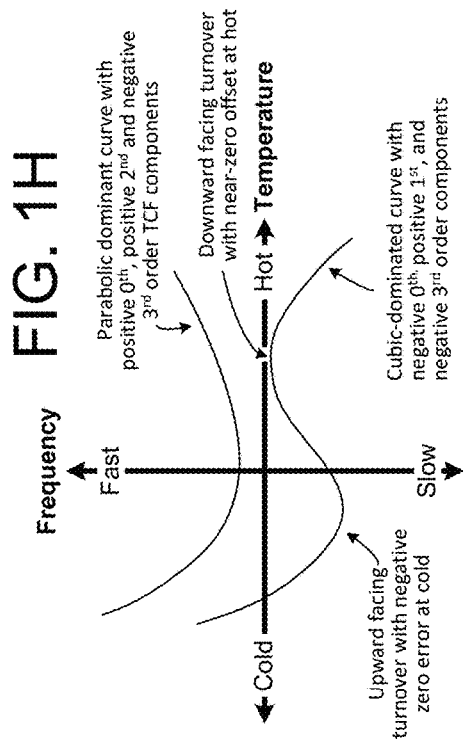
FIG. 1H
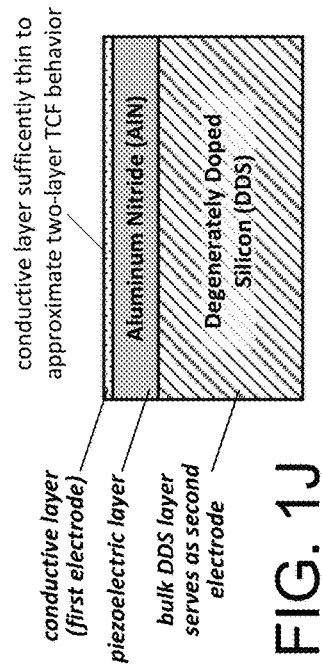
FIG. 1J
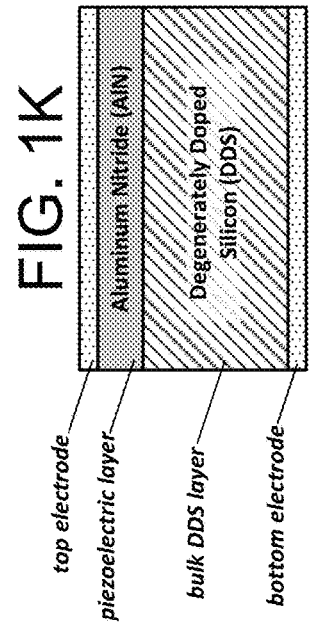
FIG. 1I
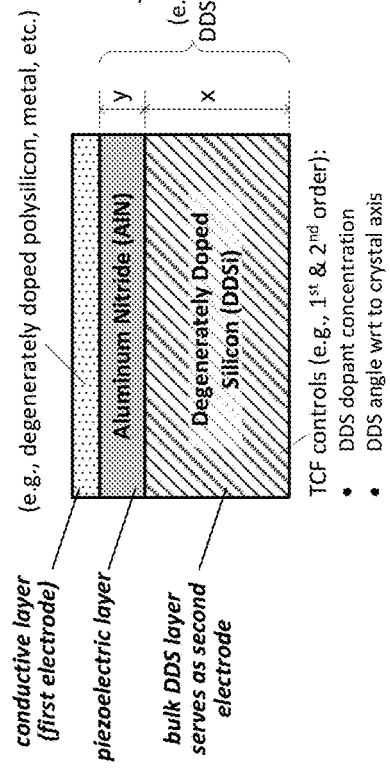
FIG. 1K
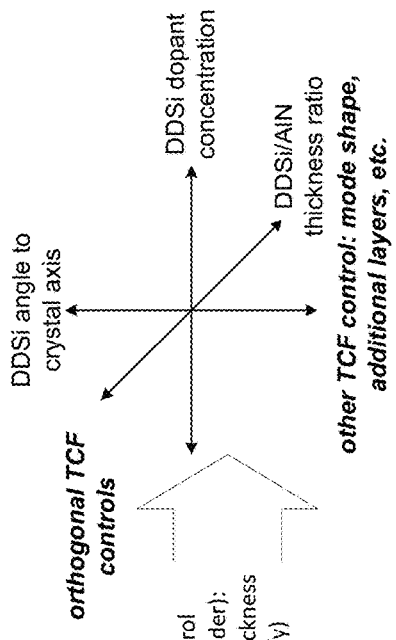

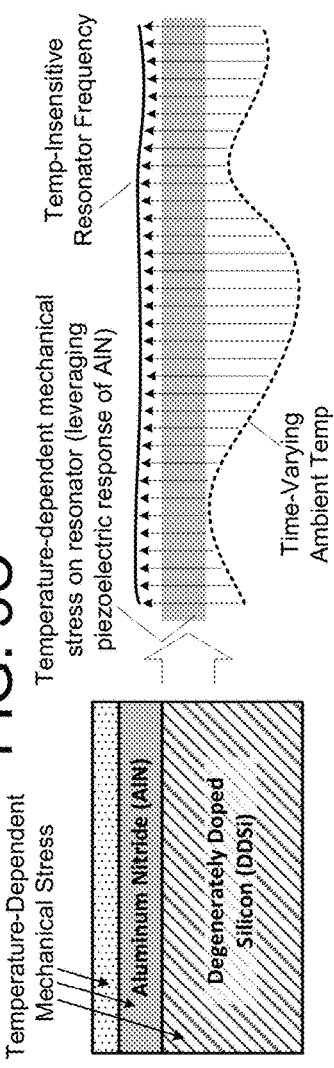
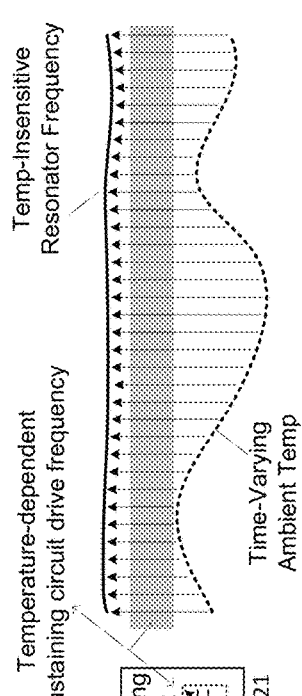
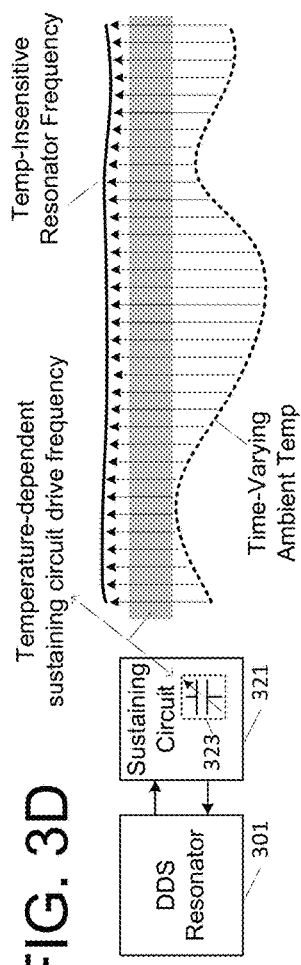
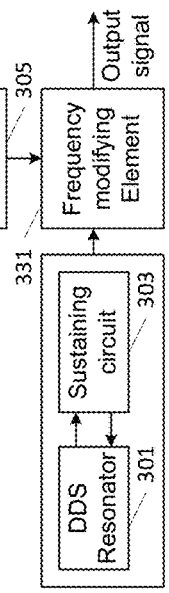
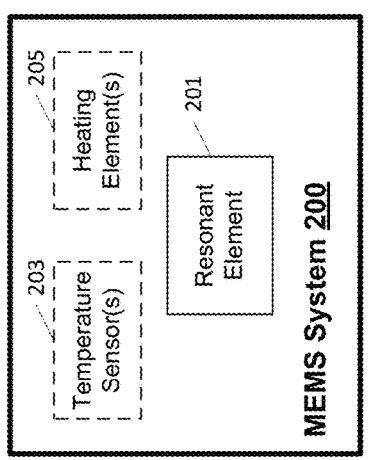
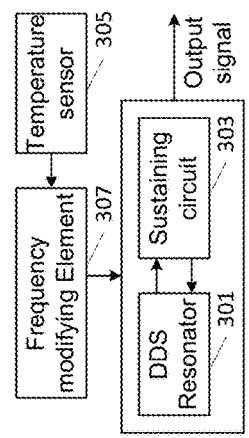
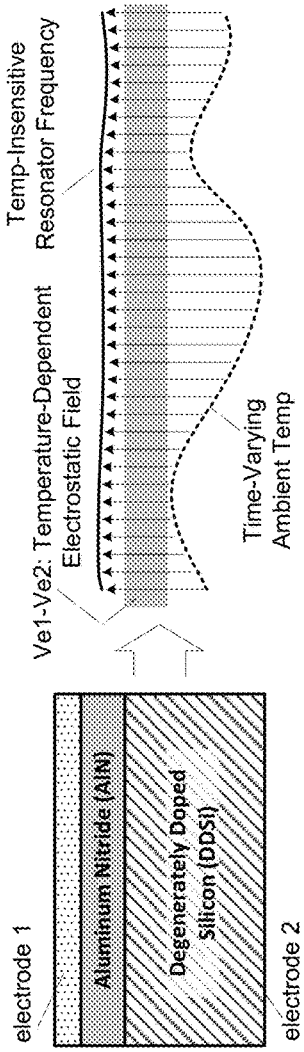

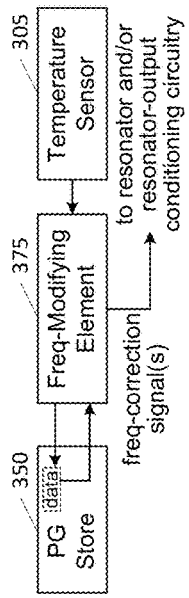
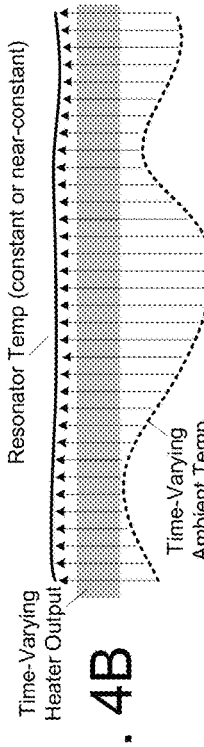
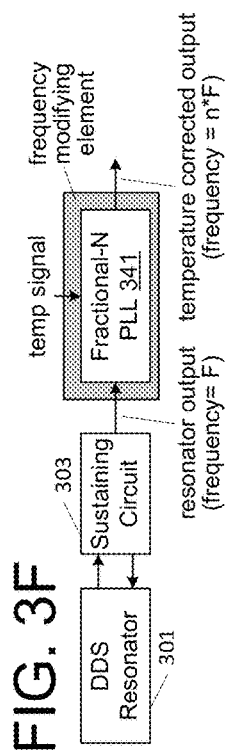
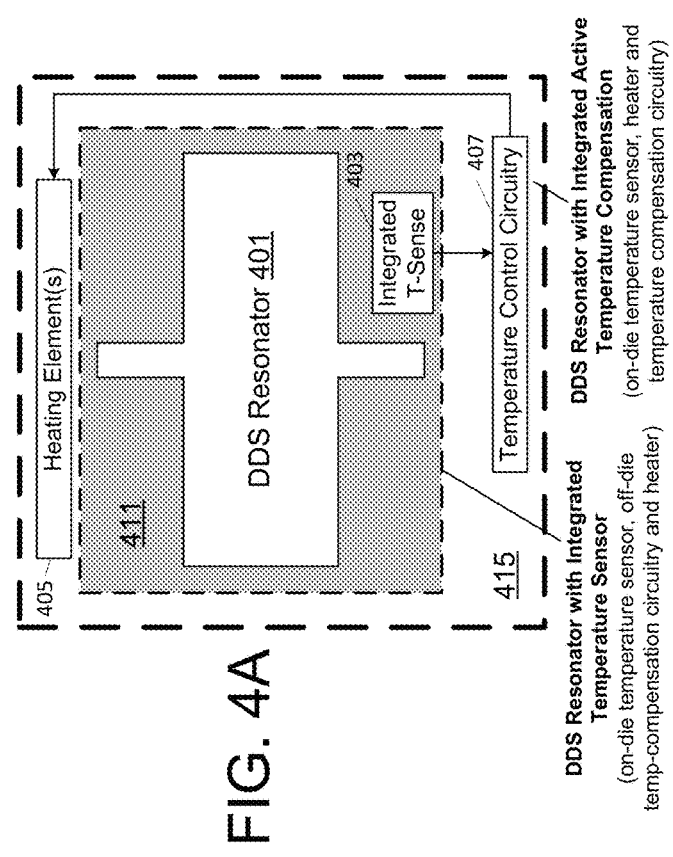
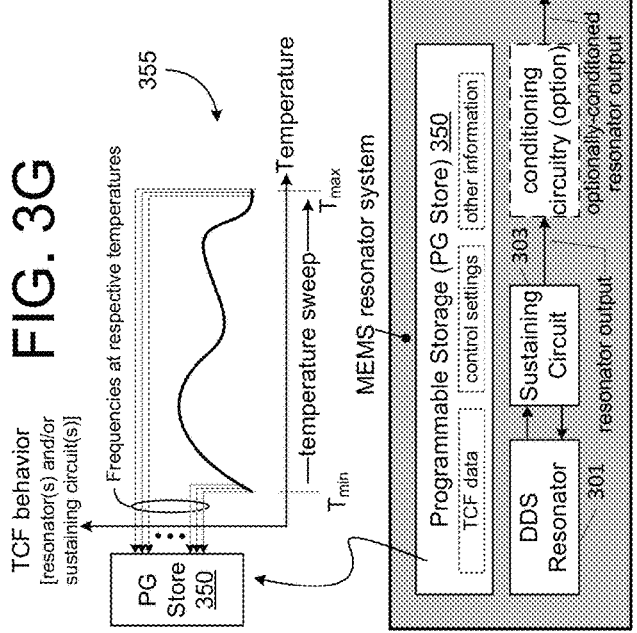
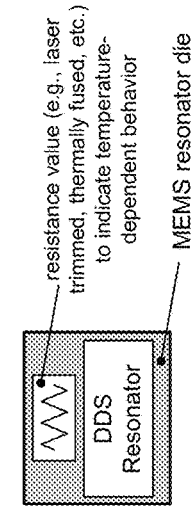
FIG. 3F
FIG. 3G
FIG. 3H
FIG. 3I
FIG. 4A
FIG. 4B

PIEZO-ACTUATED MEMS RESONATOR WITH SURFACE ELECTRODES

CROSS-REFERENCE TO RELATED APPLICATIONS

This application is a divisional of U.S. patent application Ser. No. 15/627,029 filed Jun. 19, 2017, which is a divisional of U.S. patent application Ser. No. 14/617,753 filed Feb. 9, 2015 (now U.S. Pat. No. 9,705,470), which claims priority to U.S. Provisional Patent Application No. 61/937,601 filed Feb. 9, 2014. Each of the above-identified patent applications is hereby incorporated by reference herein.

TECHNICAL FIELD

The disclosure herein relates to the field of microelectromechanical systems (MEMS).

INTRODUCTION

Resonators are a fundamental component of modern technology, commonly used in timing, sensing, and signal processing applications. Devices such as oscillators, sensors, actuators, filters, etc. may be constructed in whole or in part using resonant structures.

A resonator may be viewed as a passive system for which the linear response function exhibits several oscillatory cycles before decaying substantially. Two principal parameters that describe a resonator are the oscillation frequency of the linear response function, known as the natural frequency, and the rate of decay of the linear response function. The natural frequency divided by twice the exponential decay rate is known as the quality factor, which is an important metric of resonator caliber.

Frequency stability over temperature is an important characteristic for many applications. For example, the 802.11b wireless communication standard requires frequency stability of better than +/−25 ppm over a particular temperature range, such as from −40 C to +85 C for industrial applications.

The variation in natural frequency of a resonator as a function of temperature can be described by a series expansion about a specified reference temperature $T_0$, $$f(T) = f_0 \sum_{n=0}^{\infty} \lambda_n (T - T_0)^n, \qquad (1)$$

where T is the ambient temperature, $f_0$ is the nominal resonant frequency, $\lambda_n$ is the $n^{th}$ or $n^{th}$-order temperature coefficient of frequency (TCF), and $\lambda_0$ is 1 by definition. The first TCF is also called the linear TCF, the second TCF is also called the quadratic TCF, the third TCF is also called the cubic TCF, etc. The deviation in frequency $\Delta_f$ between the frequency at the ambient temperature and the nominal frequency is commonly expressed in units of parts per million (ppm). The value of $\Delta_f$ is determined by the magnitudes and signs of the various TCF terms and the difference between the ambient temperature and the reference temperature.

Although techniques have been developed to null the first-order TCF of micromechanical resonators using a composite mechanical structure, first-order TCF nulling is increasingly insufficient to meet target frequency stability ranges, particularly in emerging applications. Also, while silicon microstructures with silicon dioxide ($SiO_2$) and germanium dioxide ($GeO_2$) coatings have been proposed for multi-order temperature compensation, such structures tend to bring additional operational and fabrication challenges. $SiO_2$ layers can increase bulk acoustic losses (thereby degrading the quality factor), interfere with the desired mode shape, reduce transduction effectiveness, produce undesired hysteretic effects (e.g., charging) and so forth. Moreover, the quadratic residual of frequency with some compensation materials can be unsuitably large. More generally, the mere proliferation of material layers (i.e., as typically required by proposed multi-order temperature compensation schemes) may degrade resonator performance, as energy losses at the material interfaces during resonance tends to lower the resonator quality factor and interfere with the desired mode shape. Fabrication complexity and cost also tend to rise quickly with increased layer count.

BRIEF DESCRIPTION OF THE DRAWING

The various embodiments disclosed herein are illustrated by way of example, and not by way of limitation, in the figures of the accompanying drawings and in which like reference numerals refer to similar elements and in which:

FIG. 1A illustrates examples of positive/negative first-order and second-order temperature coefficients of frequency (TCFs), and also shows positive and negative $0^{th}$ order TCFs (i.e., temperature-independent frequency offsets);

FIGS. 1B-1E illustrate embodiments of a resonant structure consisting of one or more materials that allow for control of first- and higher-order resonator temperature coefficients of frequency;

FIG. 1B presents a top-down view of a resonator having a degenerately doped semiconductor (DDS) layer, with dashed lines indicating possible electrode configurations on and off the resonator (such electrodes may be patterned) and shown partitioned on the resonator into two side-by-side electrodes (many alternative patterns are possible);

FIGS. 1C-1E show cross sections of the structure through the dashed line segment A-A';

FIG. 1C illustrates a resonator embodiment constructed of a single material capable of controlled TCF engineering such as a degenerately doped semiconductor;

FIG. 1D shows the addition of a second layer that might serve electrical, mechanical, or other functions;

FIG. 1E shows a three layer resonator embodiment where the second layer might be a piezoelectric material and the third layer might be a conductive material, possibly patterned and in which electrical connections can be made to the structure in a variety of ways (a non-exhaustive list of example electrical connections are labeled as electrodes or electrode regions);

FIG. 1F illustrates an embodiment of a resonator having a degenerately doped semiconductor layer in which dopant concentration and/or type is non-uniform across the resonator body;

FIG. 1G illustrates an embodiment of a resonator having regions in or on the resonator of a locally deposited or patterned material with desired properties;

FIG. 1H illustrates examples of engineered TCFs within resonator embodiments of FIGS. 1B-1G and other embodiments disclosed herein;

FIG. 1I illustrates an embodiment of a three-layer resonator that includes a degenerately doped single-crystal silicon layer coated in aluminum nitride (to form a piezoelectric layer) and an additional conductive layer (e.g., a metal layer or another degenerately doped polysilicon electrode layer);

FIG. 1J illustrates the resonator embodiment of FIG. 1I in which the conductive layer is made sufficiently thin to render its contribution to the TCFs of the composite structure negligible;

FIG. 1K illustrates an embodiment of a MEMS resonator having degenerately doped single-crystal silicon layered with aluminum nitride and with those two layers sandwiched between top and bottom electrodes;

FIG. 2 illustrates an embodiment of a MEMS system in which a resonator is co-fabricated on a single substrate with a temperature sensitive element and a heater (the temperature sensitive element and/or the heater can be optionally excluded in alternative embodiments);

FIGS. 3A-3E illustrate embodiments of MEMS systems in which a temperature-stable MEMS resonator is combined with additional active temperature compensation for improved frequency stability over temperature;

FIG. 3A illustrates an embodiment of a MEMS resonator system in which the oscillation frequency of a resonator and sustaining circuit (combined to form an oscillator) is modified as a function of temperature;

FIG. 3B illustrates a more detailed embodiment of the system in FIG. 3A in which resonator frequency is tuned using an electrostatic field generated by control electrodes;

FIG. 3C illustrates a more detailed embodiment of the system in FIG. 3A in which resonator frequency is tuned through static mechanical stress using an electrostatic field within a piezoelectric material;

FIG. 3D illustrates a more detailed embodiment of the system in FIG. 3A in which a tunable capacitive load is provided within the oscillator (and more specifically within a sustaining circuit) in series with the resonator.

FIG. 3E illustrates an alternative approach to temperature compensation that effects a temperature-dependent frequency modification of the oscillator output;

FIG. 3F illustrates an MEMS resonator system in accordance with FIG. 3E and in which a temperature-dependent signal is be provided to a fractional-N phase locked loop to generate an output frequency that is substantially more stable over temperature than the raw output of the resonator and sustaining circuit;

FIG. 3G illustrates programmable/storage circuitry that may be employed in connection with resonator system embodiments of FIGS. 3A-3F to store TCF coefficients, control settings or other information useful for controlling resonator operation.

FIG. 3H illustrates an embodiment of a MEMS resonator die having a DDS resonator and a resistive element that is laser-trimmed (or otherwise set or established) to indicate one or more values relating to behavior of the MEMS resonator over temperature;

FIG. 3I illustrates a MEMS resonator system that employs a programmable storage as shown in FIGS. 3G and/or 3H;

FIG. 4A illustrates an embodiment of a degenerately-doped-silicon MEMS resonator integrated with one or more components of an active temperature compensation system;

FIG. 4B illustrates an example of a temperature compensation operation within the embodiment of FIG. 4A;

DETAILED DESCRIPTION

Figure 5A:
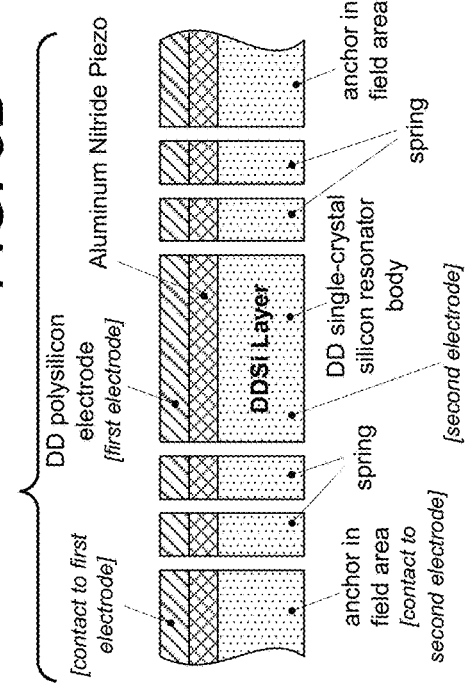
FIG. 5A illustrates an embodiment of a DDS resonator having one or more features described in connection with FIGS. 1B-4B.

In various embodiments disclosed herein, the material properties of a degenerately doped semiconductor (DDS) and the manner of its deployment within a monolithic or composite resonant structure are engineered to control the linear TCF and at least one higher order TCF of a resonant mode of the structure, thus enabling increased control over the frequency-temperature relationship of the resonant structure. For example and without limitation, the semiconductor material chosen, its crystal size and orientation, dopant type(s) and concentration(s), resonator geometry (including resonance mode shape and orientation relative to the crystal axis), may all be parameterized within a "DDS resonator" design and thus used as adjustable "knobs" for TCF engineering.

In other embodiments, a composite structure, of which at least one constituent material is a degenerately doped semiconductor, is engineered to control the linear TCF and at least one higher order TCF of a resonant mode of the structure. In addition to methods of engineering monolithic resonators, in composite resonators, the geometry and orientation of various component materials and their relation to the resonance mode shape may be adjusted for TCF engineering. One example of such a composite structure includes a degenerately doped semiconductor material and a piezoelectric material and is engineered to control the linear TCF and at least one higher order TCF of a resonant mode of the structure. As a more specific example, a composite structure including degenerately doped silicon (an example of a DDS) and aluminum nitride (a piezoelectric material) is engineered to achieve a resonance mode for which the first- and second-order TCFs are both substantially zero or within a specified tolerance of zero over a predefined or programmed temperature range.

In yet other embodiments, one or more resonator layers or regions made from a degenerately doped semiconductor serves at least two functions: enabling one or more TCFs of a resonant mode to be specifically engineered, and serving as an electrical conductor within the resonator. In a number of implementations, two or more electrically-isolated DDS layers of a resonant structure are applied in such a multi-function capacity, contributing to engineering of one or more TCFs of the composite structure and serving as respective electrical conductors.

In further embodiments, a DDS resonator as described above may be integrated with one or more components of an active temperature compensation (ATC) system that maintains the DDS resonator at/within a programmed or pre-defined temperature or range of temperatures (e.g., for diagnostic, measurement, calibration, operational control or other purposes). A combined DDS resonator and ATC system (whether integrated or not) may be designed to generate an output signal with improved temperature stability compared with a passively-compensated resonator alone.

The improved temperature stability of a DDS resonator may enable more resolute or fine-grained active frequency-compensation approaches that may not be feasible with a less temperature-stable MEMS resonator (e.g., electrostatic tuning that achieves relatively small tuning range). Examples of frequency-compensation approaches that may become viable (or more effective, efficient, etc.) through use of more temperature-stable DDS resonators include electrostatic control electrodes, capacitive loading in series with the resonator, mechanical stress tuning using a piezoelectric material, and fractional-N phase locked loops, to name a few.

Multi-Order TCF Compensation

In contrast to many conventional temperature compensation schemes, TCF-compensating embodiments disclosed herein compensate not only for the first-order TCF, but also higher-order TCF terms (e.g., the quadratic and cubic TCFs)—a more complex "multi-order" compensation which turns out to be important for many applications. Examples of such applications, include (without limitation) resonators engineered to:

- null or otherwise attenuate (e.g., to zero, substantially zero, or an otherwise negligible level) the first, second, third, and fourth order TCF terms or any two of those.
- exhibit a nonzero value of the linear TCF specifically chosen to partly or wholly compensate (or cancel or counteract) the cubic TCF and thereby reduce the absolute frequency variation over a particular temperature range.
- exhibit one or more local extrema in the temperature-dependent frequency (i.e., having a temperature at which a local minimum or maximum frequency occurs), also called "turn-over temperatures."
- exhibit a turn-over at the nominal operating temperature.

Also, in a departure from TCF compensation schemes that cumulatively apply material layers to compensate respective TCF terms (e.g., one or more material layers to compensate for first-order TCF, one or more other material layers to compensate for second-order TCF, etc.), embodiments of temperature-engineered resonant structures disclosed herein include a semiconductor layer or region engineered to compensate, by itself, for both the linear TCF and one or more higher-order TCFs and thus enable construction of "short stack" MEMS resonators—resonators consisting of a reduced number of material layers relative to layer-per-TCF implementations. For one example, the linear TCF of a resonator fabricated from an anisotropic degenerately doped semiconductor, such as single-crystal silicon, is adjusted by rotating the orientation of the resonator geometry relative to underlying crystal axes. As a second example utilizing an anisotropic degenerately doped semiconductor, the linear TCF of a resonator is tuned by altering the geometry of the resonator and/or the mode shape. As another example, in a number of embodiments, a semiconductor material is doped to a sufficiently high concentration that the polarity of the second-order TCF (i.e. the sign of the quadratic TCF) of a resonator constructed from that material is reversed relative to the second-order TCF of a resonator constructed from a more lightly doped version of that semiconductor (e.g., yielding a positive quadratic TCF, in contrast to the negative quadratic TCF exhibited at lower dopant concentrations). The reverse-polarity quadratic TCF may be exploited to partially or wholly cancel the quadratic TCF of one or more other materials (for example a piezoelectric material having a quadratic TCF polarity opposite that of a degenerately doped semiconductor material) within a composite resonator embodiment over a given temperature range, thus producing a resonator with a reduced quadratic TCF magnitude. As explained, a resonant structure with engineered linear and higher order TCFs can be fabricated exclusively from a degenerately doped semiconductor, or degenerately doped semiconductors may be deployed within composite resonant structures to enable engineered temperature stability. For example, composite structures suitable for piezoelectric micromechanical resonators are disclosed below and address the problems of frequency stability over temperature and the engineering of linear and higher-order TCFs. As discussed, such composite structures offer high quality factor, low hysteresis over temperature, low aging of frequency over time, compatibility with batch micro-fabrication methods, small form factor, insensitivity to shock and vibration, and other desirable features.

Resonant structures as described herein may be fabricated wholly or partly from a degenerately doped monocrystalline or polycrystalline semiconductor (e.g., silicon, germanium, diamond, carbon, silicon carbide, compound semiconductors such as silicon germanium, etc.) or using combinations of such semiconductors. Pure and lightly-doped semiconductors are insulating materials at low temperature. When the semiconductor is doped with certain impurity atoms, above some dopant concentration the semiconductor will exhibit metallic or highly conductive behavior even at low temperatures (e.g. for single crystal silicon, approaching 0 Kelvin). Such a semiconductor is said to be "degenerately doped". For example, in single-crystal silicon, this may occur at a phosphorus doping level at or above $4E18$ atoms/cm$^3$. More generally, the onset of degeneracy varies with semiconductor and dopant. In addition to a change in electrical conductivity, various material properties of semiconductors change with doping level, as well as the temperature dependencies of various material properties. In particular, resonators fabricated with a degenerately doped semiconductor can exhibit significantly different TCFs than similar resonators constructed with a more lightly doped version of the semiconductor material. In some cases, it is even possible to reverse the sign (or polarity) of one or more TCFs by altering the doping level of a semiconductor used as a structural material in a resonator. These temperature-dependency changes are exploited in a number of resonator embodiments to enable sophisticated, targeted engineering of temperature coefficients.

In specific embodiments of resonant composite structures disclosed herein, two of the constituent materials are a degenerately doped semiconductor (DDS) and a piezoelectric material. This composite structure, an example of a DDS resonator, can be engineered to simultaneously achieve target values or ranges of values for two or more of the TCFs of a particular resonance mode. In one embodiment, for instance, a composite structure is constructed from degenerately doped silicon (a semiconductor) and aluminum nitride (a piezoelectric material) and engineered such that the first-order and second-order TCFs of a particular resonance mode of the structure as a whole (i.e., the linear and quadratic TCFs, respectively) are both within a specified tolerance from zero, thus yielding a temperature-insensitive resonator or temperature-compensated resonator.

Examples of the piezoelectric materials include but are not limited to aluminum nitride, zinc oxide, quartz or lead zirconate titanate. In addition to the two primary constituent materials, additional materials may be present in the composite structure. In particular, another conductive material such as metal or another semiconductor layer (which may also be degenerately doped) may also be included to serve as an additional electrode (as discussed below, the DDS layer may serve as another electrode within the composite structure). Examples of suitable electrode materials include but are not limited to heavily doped silicon, silicides, tungsten, molybdenum, titanium or aluminum. The term electrode is used herein to mean, without limitation, a conductive material used to establish an electric field for transduction of electrical to mechanical energy or mechanical to electrical energy. Note that layers applied as electrodes may also serve other functions, for example and without limitation, a piezoresistive function, a heating function, etc.

The embodiments disclosed herein address many or all of the aforementioned problems and issues for resonator performance through engineering multiple parameters or design degrees of freedom of a structure with reduced sensitivity to temperature while providing piezoelectric coupling for some structures, high quality factor, low hysteresis, low aging, batch micro-fabrication compatibility, small form factor, insensitivity to shock and vibration, etc.

Mechanical Resonators

For mechanical resonators, the natural frequency is determined principally by the mass density and the stiffness of the material from which the resonator is constructed. The change in material stiffness due to change in ambient temperature is of principal concern in the design and manufacture of resonators because it changes the natural frequency of the resonator. The change in material geometry due to thermal expansion or contraction is also a concern as it also changes the natural frequency of the resonator.

For pedagogical purposes, it can be illustrative of the principle of TCF engineering to examine a simple model. One such model is where the resonator structure is constructed of thin layers and only the motion of the material on a single axis is considered. For this simple example, the stiffness of a material is described by a single number, the effective elastic modulus. This is a simplification of the physical case where all dimensions of motion should be considered and the stiffness of a material might be described by a tensor. In the simple model, the elastic modulus of an anisotropic material depends on the material orientation.

For composite structures, a simple model for the $n^{th}$ temperature coefficient of frequency is a weighted average of the contributions of all constituent parts of the resonator. This average can be written as follows for a stack of thin films (or layers) of material:

$$\lambda_n = \frac{\sum_i \lambda_n^{(i)} E_i t_i}{\sum_i E_i t_i} \quad (2)$$

where the sum over i is taken over all films in the stack, $t_i$ is the thickness of the $i^{th}$ film, $E_i$ is the elastic modulus of the $i^{th}$ film, and $\lambda_n^{(i)}$ is the $n^{th}$ material TCF for the $i^{th}$ film. The coefficient $\lambda_n^{(i)}$ is a material parameter of the $i^{th}$ film that lumps together the contributions from thermal expansion and temperature-sensitivity of the elastic modulus to give the temperature coefficient of frequency for a resonator constructed of that material alone. Equation (2) can be generalized for composite structures with arbitrary geometries, non-uniform, and anisotropic materials. Note that, in that case, the $\lambda_n^{(i)}$ coefficients can be tensors. The $n^{th}$ TCF for a resonator constructed out of at least one material is $\lambda_n$.

Equation (2) shows that the first requirement for engineering the temperature coefficients of a resonator's frequency using composite materials is to use materials that bracket the desired values. For example, if $\lambda_n$ is desired to be zero, this result can be obtained if at least one $\lambda_n^{(i)}$ is positive and at least one other $\lambda_n^{(j)}$ is negative.

Equation (2) also indicates that in order to simultaneously engineer N temperature coefficients such that $\lambda_n = \lambda_n^*$, where $\lambda_n^*$ is the desired value of the $n^{th}$ coefficient, equation (2) can be split into N separate equations. Typically the solution of N equations is obtained with the variation of at least N variables. These N variables can be called design variables and they should have sufficient design authority such that the solution to these N equations is in an accessible space. Design authority is a description for the magnitude of the effect that a change in a given design parameter has on a metric of interest. The accessible design space depends on fabrication constraints (e.g. material selection, film thickness ranges and control accuracy) and operation constraints (e.g. quality factor, frequency, motional resistance).

Despite the traditional emphasis on linear TCF control, analysis shows that composite resonator performance may be substantially increased through control over at least the first two temperature coefficients. As mentioned above, a resonator implementation that exhibits control over at least the first two temperature coefficients of frequency can be constructed from aluminum nitride and degenerately doped single crystal silicon. Such a resonator can be compatible with piezoelectric transduction and may exhibit other advantageous properties including but not limited to high quality factor, low hysteresis over temperature, low frequency aging over time, batch micro-fabrication compatibility, small form factor, and insensitivity to shock and vibration.

In addition to controlling at least the first-order and second-order TCFs, the following non-exhaustive list of criteria were applied in designing selected resonator embodiments disclosed herein:

The temperature coefficients of the individual materials combine to yield the target temperature coefficient of frequency for the overall structure. For example, if the target first-order TCF is at or near zero, and the first-order TCFs of at least one component-material is substantially positive, then the first-order TCF of at least one other component-material is engineered and/or selected to be negative.

There are N design parameters to enable control over N temperature coefficients.

The combination of design parameters have sufficient design authority to enable a solution within the design space defined by fabrication constraints and design constraints.

Aluminum nitride resonators typically have negative linear and quadratic TCFs. The temperature coefficients of thin film polycrystalline aluminum nitride depend weakly on the film structure. Similarly, resonators constructed from non-degenerate single-crystal silicon have negative linear and quadratic TCFs, and the TCFs tend to be only weakly dependent on crystal orientation.

The linear TCF of a resonator constructed from degenerately doped single-crystal silicon can be positive or negative depending on crystal orientation, doping level and mode shape. Thus, crystal orientation constitutes a design parameter (or design degree of freedom) that may be adjusted to control the linear TCF term. The quadratic TCF of a resonator constructed from degenerately doped single-crystal silicon can be positive or negative depending on dopant concentration, crystal orientation, doping level and mode shape. FIG. 1A illustrates examples of such positive/negative first-order and second-order TCFs, and also shows positive and negative $0^{th}$ order TCFs (i.e., temperature-independent frequency offsets).

It becomes possible to independently tune (i.e., control and potentially null) both the first-order and second-order (linear and quadratic) TCF characteristics of a degenerately doped single crystal silicon layer through manipulation of orthogonal design parameters, for example, crystal orientation and dopant concentration. Polycrystalline silicon resonators can be degenerately doped to achieve a range of linear and quadratic TCF values, although if the material lacks a dominant crystallographic orientation then one design degree of freedom may be lost.

FIGS. 1B-1E illustrate exemplary embodiments of a DDS resonator with a plan view of the resonator shown at 1a together with optional electrode dispositions within and adjacent the resonant structure.

Referring first to FIG. 1B, a resonant structure including at least one degenerately doped semiconductor layer ("DDS Resonator") is disposed between two electrode structures (e.g., used for driving and sensing the resonator, respectively) and having one or more anchor points. In the embodiment shown, beams extend from opposite sides of the resonator body to establish dual anchor points, though more or fewer anchor points may apply in alternative implementations. Also, while an oblong or rectangular resonator shape is depicted, DDS resonators may be fabricated in any practicable shape according, for example, to application demands.

The electrodes on either side of the DDS resonator are shown in dashed outline to emphasize their optional nature (a convention applied in other drawings herein, though the absence of dashed-line presentation should not be construed as meaning that a given element or structure is required). Also, one or more electrically-isolated electrode regions may be implemented within a given resonator layer as shown by the T-shaped regions outlined within the resonator body. One or more alternately-shaped electrode regions (i.e., having different shapes than those shown) may be employed in alternative embodiments, and the resonator body itself may also be employed as an electrode.

In the case of a single-layer degenerately doped silicon resonator, the motion of the resonator can be sensed electrostatically or piezoresistively with appropriate electrical connections. FIGS. 1C-1E illustrate cross-sections of exemplary material stacks (i.e., across the resonant structure at line A-A' in FIG. 1B) including a monolithic (single-layer) stack at 1C, two-layer material stack at 1D and three-layer material stack at 1E. As explained below, additional material stacks and/or stacks of different material than shown in FIGS. 1C-1E may be present in alternative embodiments. As discussed above, because a single layer of uniformly degenerately doped silicon possesses at least two design parameters (crystallographic orientation and dopant concentration), a single-layer resonator (FIG. 1C) composed of uniformly degenerately doped single-crystal silicon can be engineered to have first-order and second-order TCFs that are equal or near to zero through the combination of fabrication process and design. Moreover, the dopant concentration need not be uniform. This allows for an arbitrarily large number of design parameters (i.e., "knobs" or degrees of freedom for manipulating resonator performance through design). It may also be advantageous to create one or more regions in or on the resonator that have different dopant concentration and/or different dopants as shown, for example, by the different degrees of shading in FIG. 1F. As shown in FIG. 1G, regions in or on the resonator could also be created with a locally deposited or patterned layer of material with desired properties. Locating these regions in areas of high stress in the vibrational mode shape of the resonator, for example, may be advantageous, enabling control over first, second, third, or higher order TCF values.

The resonator can also be engineered to have non-zero but controllable first- and second-order TCFs in order to accomplish specific design intent. For example, the first-order TCF can be designed such that it minimizes the total frequency variation over temperature by compensating for third-order and other odd-numbered higher order TCFs. As another example, the first-order TCF can be designed in order to adjust the temperature at which the frequency change with respect to temperature reaches an inflection point, a local minimum or a local maximum. The temperature at which the resonator reaches a local minimum or maximum frequency is commonly referred to as a turnover temperature. The resonator TCF may also be designed to cancel the TCF associated with its sustaining circuit (i.e. a circuit that sustains the mechanical motion of the resonator) or oscillator system. As a final example, the first- and second-order coefficients can be selected such that they are relatively insensitive to angle and dopant concentration for improved manufacturability. FIG. 1H illustrates examples of such engineered TCFs.

Referring again to FIG. 1D, a two-layer resonator composed of degenerately doped silicon and an additional film can be constructed. If the silicon layer is single crystal then this structure possesses at least three design parameters: crystallographic orientation and dopant concentration as described above, and additionally the ratio of the silicon thickness to the thickness of the added film. Thus, a two-layer resonator composed of degenerately doped silicon and an additional film may be capable of controlling three TCFs. In a number of embodiments, including that shown in FIG. 1c, the additional film is a piezoelectric material (e.g., aluminum nitride), though the additional film (or other material layer) may alternatively be any semiconductor, insulator or metal material selected for its TCF coefficients or another desirable mechanical or electrical property.

Additionally, a three-layer resonator can be formed as shown in FIG. 1E (i.e., with or without electrically isolated electrode regions as discussed). In one embodiment, shown for example in FIG. 1I, such a three-layer resonator includes a degenerately doped single-crystal silicon layer that is coated in aluminum nitride (to form a piezoelectric layer) and an additional conductive layer (e.g., a metal layer or another degenerately doped polysilicon electrode layer). As shown by the TCF control diagram in FIG. 1I, the first- and second-order TCFs can be controlled by varying the crystal orientation of the bottom (single-crystal) silicon at a particular doping level and thickness, the aluminum nitride thickness, and the polysilicon thickness at a particular dopant concentration. The preferred crystal orientation in the polysilicon film may also affect the first- and second-order TCFs. An alternative set of design parameters can be chosen in order to engineer the TCF of the film stack, and the previous example is just one of many possibilities. Additionally, as shown at FIG. 1J, one of the layers in a three-layer resonator can be made sufficiently thin that its contribution to the TCFs of the composite structure is minimal (e.g., negligible or otherwise attenuated) and the compensation problem reduces to that of the two-layer resonator case. For example, the top layer may be implemented by a thin conductive metal or semiconductor layer instead of a degenerately doped polysilicon electrode layer.

Additional layers can be added to the stack. One example, shown for example in FIG. 1K, includes a degenerately doped single-crystal silicon with aluminum nitride sandwiched between a top electrode and bottom electrode. The electrodes can be manufactured from any conductive metal or semiconductor film, for example polysilicon, aluminum, molybdenum, titanium, tungsten, or a silicide formed using a metal and silicon.

In a number of embodiments, including those shown in FIG. 1B-1E, multiple degrees of freedom are applied to compensate multiple temperature coefficient orders. When degenerately doped silicon is used for temperature compensation it can provide control over the first- and second-order terms. Degenerately doped single crystal silicon incorporates at least two degrees of freedom into a single layer: crystal orientation and dopant concentration. In principle, a third degree of freedom is available once a piezoelectric film is deposited on the highly doped single crystal silicon determined by the thickness ratio of the films. This additional design authority is illustrated in FIG. 1I.

Degenerately doped silicon can replace the function of multiple films that are otherwise used in temperature compensated piezoelectric resonators including, for example and without limitation, oxide temperature compensation layers and metal electrode layers. The sheet resistance of silicon is a function of its thickness and carrier concentration, and degenerately doped temperature compensation layers have sufficiently low sheet resistance (e.g., less than 1 ohm/square) to provide low electrical impedance. Material interfaces in composite resonators tend to introduce mechanical dissipation and the potential for a degradation of frequency hysteresis over temperature and frequency aging, and thus, though counterintuitive in view of functional benefits that may result from additional resonator layers, a reduction in the number of resonator layers tends to enhance engineering control of frequency stability over temperature.

In various embodiments, a single MEMS system may include multiple elements co-fabricated on the same substrate as a DDS resonator. Referring to FIG. 2, for example, a MEMS system 200 may include a DDS resonant element 201 (i.e., one form of MEMS resonator), one or more temperature sensing elements 203 ("temperature sensor"), and one or more heating elements 205 ("heater"). The temperature sensitive element may be used as part of an active temperature compensation system. One example of a temperature sensing element is a thermistor, which has a temperature-dependent electrical resistance. A heater may be included for initial calibration of the resonator frequency stability or to maintain the MEMS system at an approximately constant temperature despite variation in the ambient temperature. The temperature sensor and/or heater may be optionally excluded from the MEMS system. As described above, the resonator structure may be used as a sensor instead of a frequency reference. Examples of alternative resonator applications include filters, gyroscopes, accelerometers, pressure sensors, microphones, magnetometers and mass sensors.

DDS resonators as described herein may be deployed with or without supplemental temperature compensation, thus effecting a purely passive temperature compensation scheme, or a combination of, for example, passive and active temperature compensation. Although active electrical compensation circuits, by definition, increase system power consumption, a combination of passive and active compensation (e.g., DDS resonator in combination with active compensation circuitry) may enable stability targets to be achieved with less power than active compensation alone, or enable greater stability than could be achieved with either approach alone. Passive mechanical temperature compensation is possible through material selection and structure design in both homogenous and composite resonator structures.

DDS resonators as disclosed herein may be combined with additional elements to form a system with improved temperature stability and/or other useful functionality. In FIG. 3A, for example, a DDS resonator 301 is combined with a sustaining circuit 303 to form an oscillator. The resonant frequency of the oscillator may be modified in a temperature-dependent manner (i.e., as shown in FIG. 3A, a temperature signal from sensor 305 is received within frequency modifying element 307 which, in turn, provides a temperature-dependent a resonant-frequency control signal to DDS resonator 301 and/or sustaining circuit 303) and to yield a resonant frequency with improved temperature stability compared to that achievable with the DDS resonator alone. For example, a temperature-dependent electrostatic field may be applied directly to the DDS resonator using control electrodes that are co-fabricated with the resonator. An example of this approach is shown in FIG. 3B, with electrodes formed by the DDSi layer (electrode 2) and conductive layer (electrode 1) of the three-layer resonator embodiment described above (i.e., having DDSi, AN and conductive layers, though other resonator structures/materials may be used in alternative embodiments), and the temperature-dependent electrostatic field formed by the time-varying and temperature-dependent difference between the potentials at the two electrodes, Ve1-Ve2.

As another example, if one component of the resonator has a significant piezoelectric response, the mechanical stress on the resonator can be modified in a temperature-dependent manner to adjust the resonator frequency. FIG. 3C illustrates an example of such an arrangement, again in the context of the tri-layer DDSi/AlN/conductive-material resonator discussed above, though other resonator structures and/or materials may be used.

In another embodiment, shown for example in FIG. 3D, a capacitive element may be included in a resonator sustaining circuit 321 and its capacitance can be modified in a temperature-dependent manner, thereby effecting a variable capacitance element 323 that may be used, for example, to tune the frequency of the oscillator system (i.e., system including DDS resonator 301 and sustaining circuit 321).

In an alternative embodiment, shown in FIG. 3E, the resonant frequency of DDS resonator 301 is modified after being output from an oscillator (formed at least in part by the DDS resonator 301 and sustaining circuit 303, as shown) by a frequency modifying element 331 within the resonator system. In a more specific implementation, shown for example in FIG. 3F, a temperature-dependent signal (e.g., from a temperature sensor as shown at 305 in FIG. 3E) can be provided to a fractional-N phase locked loop (an example of a frequency modifying element) in order to generate an output frequency that is substantially more stable over temperature than in the case of the resonator alone.

As shown in FIG. 3G, any of the oscillator systems shown in FIGS. 3A-3F (or other oscillator systems employing a DDS resonator) may include programmable/storage circuitry 350 in which TCF coefficients, control settings or other information may be stored. TCF coefficients recorded or stored in such an oscillator system may be based on the characteristics of an individual resonator (301) or group of resonators. Additionally, the coefficients may be based on characteristics of an individual sustaining circuit (303) or group of sustaining circuits. For example, the TCF behavior of oscillators or resonators may be determined by sweeping temperature and recording frequency as shown at 355, or by measuring room temperature characteristics (e.g., resistivity, frequency, etc.) that are predictive of temperature-dependent behavior.

Programmable/storage circuitry in which the TCF coefficients or other parameters indicative of temperature-dependent behavior may be stored may include any practicable on-chip or off-chip memory elements such as, for example and without limitation, registers or other volatile or non-volatile memory elements including, without limitation one-time-programmable (OTP) memory, electrically programmable read-only-memory (EPROM), Flash memory and so forth.

The TCF coefficients, or other parameters indicative of temperature dependent behavior, may also be stored as a resistance value. As shown in FIG. 3H, for example, the MEMS resonator die may contain at least one resistor that may be trimmed in resistance by a laser (or other method, such as thermal fusing) to record a value related to the behavior of the device over temperature. A thermistor and/or heater may also be used to store information in this manner. Additional bondpads or electrical interconnects are avoided by using a thermistor, or heater, for example, for this purpose.

The stored temperature behavior information may be used by an oscillator system to improve its frequency stability. The system can read out the stored information, combine it with a temperature measurement, and apply a correction to the resonator or oscillator system frequency. This operation is shown, for example, in the embodiment of FIG. 3I, in which a frequency-modifying element 375 receives a temperature signal from sensor 305 and reads out temperature-based correction data ("data") from programmable storage 350. Frequency correction signals corresponding to the correction data are then output to a resonator, sustaining circuit and/or output conditioning circuitry (e.g., PLL as discussed above in reference to FIG. 3F).

FIG. 4A illustrates an embodiment of MEMS arrangement 121 having a DDS resonator 401 integrated with one or more components of an active temperature compensation system. The DDS resonator may be implemented in accordance with any of the resonator embodiments described herein and includes a layer (or other deposition or arrangement) of degenerately doped semiconductor material. In the embodiments shown, the temperature compensation circuitry includes one or more temperature sensing elements 403 (e.g., thermistor or other temperature sensor), one or more heating elements 405 and temperature control circuitry 407 to control operation of the heating elements (e.g., powering the heating elements as necessary to reach a predetermined or programmed temperature setpoint or temperature range). FIG. 4B illustrates an example of this temperature compensation operation, showing a time-varying heater output generated in accordance with a time-varying ambient temperature to maintain a constant or near-constant resonator temperature.

As FIG. 4A shows, integration of the DDS resonator and components of the temperature compensation system may vary from implementation to implementation. In one embodiment, shown for example in shaded region 411, DDS resonator 401 is integrated (i.e., co-fabricated with or otherwise formed on the same substrate or die) with a temperature sensor 403 ("Integrated T-Sense"), while temperature control circuitry 407 and heater 405 (i.e., one or more heating elements) are implemented off die. In another embodiment, indicated by region 415, temperature control circuitry 407 and heater 405 are integrated with temperature sensor 403 and DDS resonator 401, thus establishing a fully integrated active temperature compensation system within the resonator die. Though not specifically shown, DDS resonator 401 may alternatively be integrated with heater 405 while the temperature sensor(s) and/or temperature control circuitry remain off-die.

FIG. 5A illustrates an embodiment of a DDS resonator 500 having a number of the features described above. More specifically, DDS resonator 500 may be a single-layer structure (i.e., consisting only of a single degenerately doped semiconductor, such as degenerately doped silicon) or a multi-layer structure having, for example, aluminum nitride (AlN) or other piezoelectric layer disposed between a degenerately doped silicon layer and conductive layer as shown in FIG. 1I. Also, the dopant type or concentration within the DDS layer or any other layer of resonator 500 may be non-uniform (e.g., higher or lower concentration with high stress area 501 or other areas of the resonator body), and the resonator may be fabricated such that the resonator axis 503 is disposed at a nonzero angle, $\phi$ (i.e., the "resonator angle"), with respect to the crystallographic axis 504. As explained above, the resonator angle, DDS dopant concentration and type (including any non-uniformity) may each be specifically engineered to null first-order and at least one higher-order temperature coefficients of frequency. The mode shape, relative layer thicknesses, dopant types/concentrations of other layers (e.g., conductive layer formed from degenerately doped polysilicon) may also be specifically chosen, in combination with the dopant concentration/type of the bulk DDS layer, to yield a desired temperature-dependent resonant behavior, such as a temperature indicative behavior, temperature-stable (or temperature-insensitive) behavior, etc., over one or more desired operating temperature ranges. In the particular example shown, DDS resonator 500 has an ellipsoid shape with a pinched transverse dimension (i.e., orthogonal to resonator axis 503) between spring-bearing anchors 507a and 507b. Trenching 512 is etched or otherwise formed around and/or beneath the resonator and anchor spring elements to release the DDS resonator and anchor spring elements from (i.e., free those elements to move relative to) substrate field area 510.

Figure 5B:
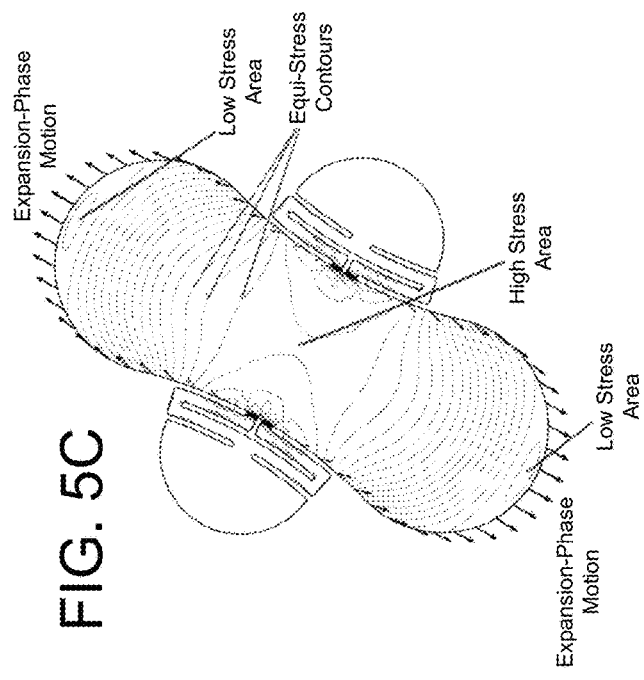
FIG. 5B illustrates an exemplary cross-section of the DDS resonator shown in FIG. 5A.

FIG. 5B illustrates an exemplary cross-section of DDS resonator 500 via line A-A in FIG. 5A, showing a degenerately-doped (DD) single-crystal silicon layer, an aluminum nitride piezoelectric layer and a degenerately-doped polysilicon electrode layer. Spring elements ("spring") and field area anchors are disposed on either side of the resonator body to form the respective anchors shown at 507a and 507b in FIG. 5A. Various other anchoring arrangements, with or without spring mounts, may be employed in alternative embodiments, including single-anchor arrangements or configurations of more than two anchors.

Figure 5C:
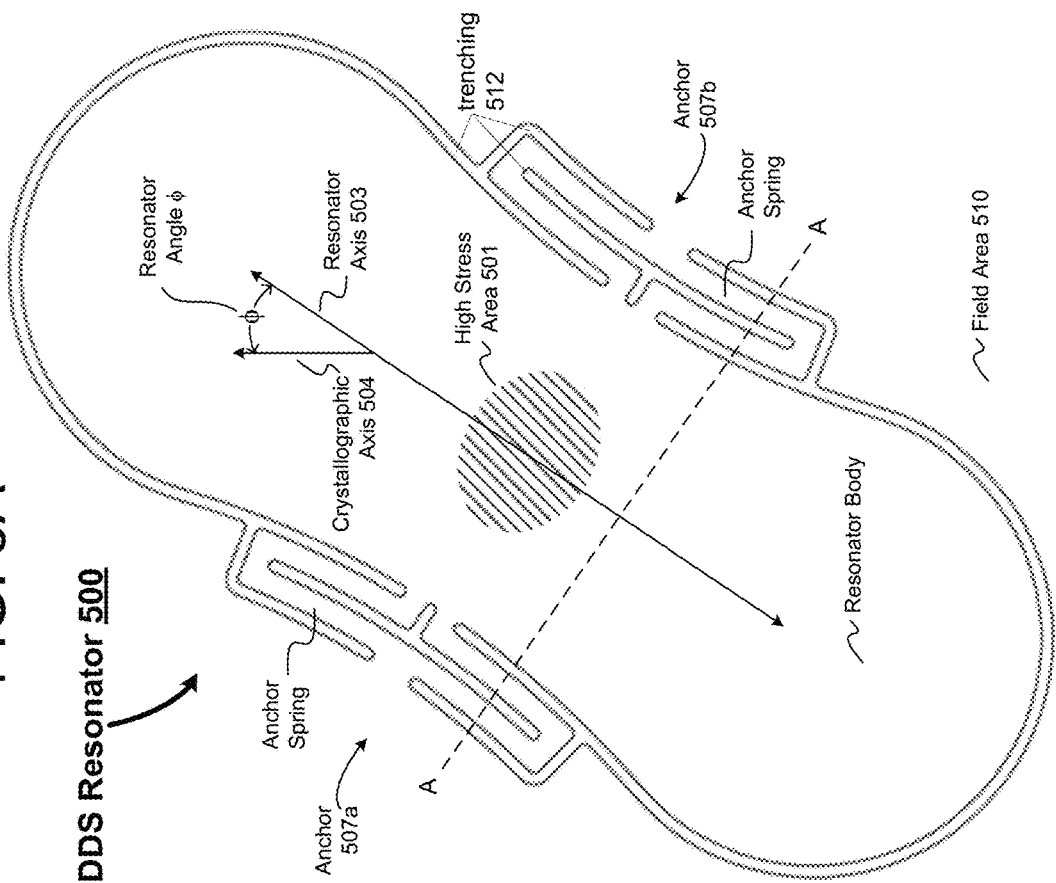
FIG. 5C illustrates an exemplary finite-element model of the DDS resonator of FIG. 5A.

FIG. 5C illustrates an exemplary finite-element model of the DDS resonator of FIG. 5A, showing displacement and stress distribution during resonant vibration (or oscillation). For example, vectors (arrows) projecting from the edge of the resonator body illustrate a direction of motion of the resonator during an expansion phase of an oscillation cycle. In the example shown, a high stress area occurs between the anchors, while low stress areas occur at opposite ends of the resonator axis (i.e., the axis shown in FIG. 5A), and equi-stress contours occur between the low-stress and high-stress areas. The stress in the anchors is near zero.

The following are at least some of the advantages that may be realized by embodiments disclosed herein:
- Degenerately doped silicon can replace two separate materials used in piezoelectric resonators to date: a temperature compensation material (e.g. $SiO_2$) and an electrically conductive material (e.g. Mo). Degenerately doped silicon is capable of temperature compensation and provides sufficiently low electrical resistance (e.g. 1-50 ohms) to serve as an electrode material for many applications.
- Degenerately doped single crystal silicon facilitates improved frequency stability over temperature by allowing cancellation of both first- and second-order TCF. The doping and orientation of the degenerately doped silicon layer provide at least two degrees of freedom for cancelling at least two temperature coefficients. Examples discussed above demonstrate that first- and second-order TCF cancellation of a composite piezoelectric resonator utilizing highly doped silicon is possible and is in the accessible design space. The temperature coefficient improvements enabled by the disclosed invention lead to the possibility of less than +/−10 ppm of frequency variation across the industrial temperature range from −40 to +85 C. In contrast, micromechanical resonators with only first-order TCF compensation typically show +/−50 to 200 ppm variation over the industrial temperature range.

Elimination of the oxide and metal interfaces improves the mechanical quality factor of the resonator through the elimination of layers with potentially high acoustic loss and the elimination of interfaces which each may significantly increase the mechanical dissipation of the resonator.

Furthermore, replacement of the metal and oxide layers in the structure with a semiconductor eliminates work hardening, fatigue effects and interface effects that contribute to frequency hysteresis over temperature and frequency aging over time.

A resonator with engineered TCF characteristics may be created out of one or more layers of material. In one layer, it is possible to cancel the first and second order TCF coefficients by design and doping, if the material has qualities similar to degenerately doped silicon. There may be one or more regions in the layer exhibiting one or more material properties. For example, a single silicon layer may possess at least one region containing at least one doping level and at least one dopant. A single material layer may possess at least one region containing at least one material type. Each of these regions may add an additional degree of freedom in the resonator TCF behavior. By adjusting the size and characteristics of these regions, it is possible to affect the nominal frequency and, the first, second, third, and higher order TCF terms.

The various MEMS systems, devices, structures, components disclosed herein, as well as related circuitry (e.g., sustaining circuitry, sense circuitry, drive circuitry, conditioning circuitry, control circuitry, etc.) may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such structure and/or circuit expressions may be implemented include, but are not limited to, formats supporting behavioral languages such as C, Verilog, VHDL, and Matlab, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described structures, circuits and/or circuitry may be processed by a processing entity (e.g., one or more processors) within the computer system in conjunction with execution of one or more other computer programs including, without limitation, net-list generation programs, place and route programs and the like, to generate a representation or image of a physical manifestation of such structures, circuits and/or circuitry. Such representation or image may thereafter be used in device fabrication, for example, by enabling generation of one or more masks that are used to form various components of the circuits in a device fabrication process.

Moreover, the various structures (for example, the structures of the MEMS device), circuits and/or circuitry disclosed herein may be represented via simulations using computer aided design and/or testing tools. The simulation of the various structures and/or characteristics or operations thereof may be implemented by a computer system wherein characteristics and operations of such structures and/or circuitry, and techniques implemented thereby, are imitated, replicated and/or predicted via a computer system. The disclosed embodiments encompass such simulations of the exemplary structures and circuitry disclosed herein, and/or techniques implemented thereby.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific numbers of signal path widths, signaling or operating frequencies, component circuits or devices, material types, dopant types and concentrations and the like can be different from those described above in alternative embodiments. Additionally, links or other interconnection between integrated circuit devices or internal circuit elements or blocks may be shown as buses or as single signal lines. Each of the buses can alternatively be a single signal line, and each of the single signal lines can alternatively be buses. The term "coupled" is used herein to express a direct connection as well as a connection through one or more intervening circuits or structures. Integrated circuit device "programming" can include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

The section headings in the above detailed description have been provided for convenience of reference only and in no way define, limit, construe or describe the scope or extent of the corresponding sections or any of the embodiments presented herein. Also, various modifications and changes can be made to the embodiments presented herein without departing from the broader spirit and scope of the disclosure. For example, features or aspects of any of the embodiments can be applied in combination with any other of the embodiments or in place of counterpart features or aspects thereof.

Accordingly, the specification and drawings are to be regarded in an illustrative rather than a restrictive sense.

What is claimed is:

1. A microelectromechanical system (MEMS) resonator comprising:
   a degenerately-doped single-crystal silicon layer;
   a piezoelectric material layer disposed on the degenerately-doped single-crystal silicon layer; and
   an electrically-conductive material layer (i) disposed on the piezoelectric material layer opposite the degenerately-doped single-crystal silicon layer, and (ii) patterned to form first and second electrodes that are electrically isolated from one another;
   wherein the conductive material layer comprises heavily doped polysilicon.

2. The MEMS resonator of claim/wherein a resonator axis along which the MEMS resonator exhibits a predominant motion during resonant oscillation is offset from a dominant crystallographic axis of the degenerately-doped single-crystal silicon layer by an angle that substantially reduces at least one of first-order or second-order temperature coefficients of frequency (TCFs) of the MEMS resonator relative to first- and/or second-order TCFs that would result without angular offset between the resonator axis and the dominant crystallographic axis.

3. The MEMS resonator of claim/wherein the degenerately-doped single-crystal silicon layer and the piezoelectric material layer have respective thicknesses in a predetermined ratio that attenuates at least one temperature coefficient of frequency of the MEMS resonator.

4. The MEMS resonator of claim 1 wherein at least one of first-order or second-order temperature coefficients of frequency (TCFs) of the degenerately-doped single-crystal silicon layer and the piezoelectric material layer are opposite in sign over at least part of an operating temperature range.

5. A microelectromechanical system (MEMS) resonator comprising:
   a degenerately-doped single-crystal silicon layer;
   a piezoelectric material layer disposed on the degenerately-doped single-crystal silicon layer; and
   an electrically-conductive material layer (i) disposed on the piezoelectric material layer opposite the degenerately-doped single-crystal silicon layer, and (ii) patterned to form first and second electrodes that are electrically isolated from one another;
   wherein at least one of first-order or second-order temperature coefficients of frequency (TCFs) of the degenerately-doped single-crystal silicon layer and the piezoelectric material layer are opposite in sign over at least part of an operating temperature range.

6. The MEMS resonator of claim 5 wherein the conductive material layer comprises metal.

7. The MEMS resonator of claim 5 wherein the piezoelectric material layer comprises aluminum nitride.

8. The MEMS resonator of claim/wherein a resonator axis along which the MEMS resonator exhibits a predominant motion during resonant oscillation is offset from a dominant crystallographic axis of the degenerately-doped single-crystal silicon layer by an angle that substantially reduces at least one of first-order or second-order temperature coefficients of frequency (TCFs) of the MEMS resonator relative to first- and/or second-order TCFs that would result without angular offset between the resonator axis and the dominant crystallographic axis.

9. The MEMS resonator of claim/wherein the degenerately-doped single-crystal silicon layer and the piezoelectric material layer have respective thicknesses in a predetermined ratio that attenuates at least one temperature coefficient of frequency of the MEMS resonator.

10. A microelectromechanical system (MEMS) resonator comprising:
    a degenerately-doped single-crystal silicon layer;
    a piezoelectric material layer disposed on the degenerately-doped single-crystal silicon layer; and
    an electrically-conductive material layer (i) disposed on the piezoelectric material layer opposite the degenerately-doped single-crystal silicon layer, and (ii) patterned to form first and second electrodes that are electrically isolated from one another;
    wherein a resonator axis along which the MEMS resonator exhibits a predominant motion during resonant oscillation is offset from a dominant crystallographic axis of the degenerately-doped single-crystal silicon layer by an angle that substantially reduces at least one of first-order or second-order temperature coefficients of frequency (TCFs) of the MEMS resonator relative to first- and/or second-order TCFs that would result without angular offset between the resonator axis and the dominant crystallographic axis.

11. The MEMS resonator structure of claim 10 wherein the first electrode constitutes a drive electrode for driving the MEMS resonator into mechanically resonant oscillation, wherein the second electrode comprises a sense electrode for sensing the mechanically resonant oscillation of the MEMS resonator, and wherein the degenerately-doped single crystal silicon layer constitutes a third electrode.

12. The MEMS resonator of claim 10 wherein the first electrode constitutes a drive electrode for driving the MEMS resonator into mechanically resonant oscillation, wherein the second electrode comprises a sense electrode for sensing the mechanically resonant oscillation of the MEMS resonator, and wherein the degenerately-doped single crystal silicon layer constitutes a third electrode.

13. The MEMS resonator of claim/wherein the degenerately-doped single-crystal silicon layer and the piezoelectric material layer have respective thicknesses in a predetermined ratio that attenuates at least one temperature coefficient of frequency of the MEMS resonator.

14. A microelectromechanical system (MEMS) resonator comprising:
    a degenerately-doped single-crystal silicon layer;
    a piezoelectric material layer disposed on the degenerately-doped single-crystal silicon layer; and
    an electrically-conductive material layer (i) disposed on the piezoelectric material layer opposite the degenerately-doped single-crystal silicon layer, and (ii) patterned to form first and second electrodes that are electrically isolated from one another;
    wherein the degenerately-doped single-crystal silicon layer and the piezoelectric material layer have respective thicknesses in a predetermined ratio that attenuates at least one temperature coefficient of frequency of the MEMS resonator.

15. The MEMS resonator of claim/wherein the first electrode constitutes a drive electrode for driving the MEMS resonator into mechanically resonant oscillation, wherein the second electrode comprises a sense electrode for sensing the mechanically resonant oscillation of the MEMS resonator, and wherein the degenerately-doped single crystal silicon layer constitutes a third electrode.

16. A microelectromechanical system (MEMS) resonator comprising:
    a degenerately-doped single-crystal silicon layer;

a piezoelectric material layer disposed on the degenerately-doped single-crystal silicon layer; and an electrically-conductive material layer (i) disposed on the piezoelectric material layer opposite the degenerately-doped single-crystal silicon layer, and (ii) patterned to form first and second electrodes that are electrically isolated from one another;

wherein first-order and second-order temperature coefficients of frequency (TCFs) of the MEMS resonator and at least one TCF of the MEMS resonator beyond second-order are substantially attenuated by virtue of (i) angular offset between a dominant crystallographic axis of the degenerately-doped single-crystal silicon layer and a resonator axis along which the MEMS resonator exhibits a predominant motion during resonant oscillation, (ii) a chosen dopant concentration of the degenerately-doped single-crystal silicon layer and (iii) chosen relative thicknesses of the degenerately-doped single-crystal silicon layer and piezoelectric material layer.

17. A method of fabricating microelectromechanical system (MEMS) resonator, the method comprising:
disposing a piezoelectric material layer on a degenerately-doped single-crystal silicon layer;
disposing an electrically-conductive material layer on the piezoelectric material layer opposite the degenerately-doped single-crystal silicon layer; and
patterning the electrically-conductive material layer to form first and second electrodes that are electrically isolated from one another;
wherein degenerately doping the single-crystal silicon substrate to form the degenerately-doped single-crystal silicon layer comprises doping the single-crystal silicon substrate with impurity concentration sufficient to form, as at least part of the degenerately-doped single-crystal-silicon layer, a third electrode.

18. The method of claim 17 wherein patterning the electrically-conductive material layer to form the first and second electrodes wherein the first electrode comprises:
patterning a drive electrode for driving the MEMS resonator into mechanically resonant oscillation; and
patterning a sense electrode for sensing the mechanically resonant oscillation of the MEMS resonator.

19. The method of claim 17 wherein disposing the electrically-conductive material layer on the piezoelectric material layer comprises disposing a metal layer on the piezoelectric material layer.

20. A method of fabricating microelectromechanical system (MEMS) resonator, the method comprising:
disposing a piezoelectric material layer on a degenerately-doped single-crystal silicon layer:
disposing an electrically-conductive material layer on the piezoelectric material layer opposite the degenerately-doped single-crystal silicon layer; and
patterning the electrically-conductive material layer to form first and second electrodes that are electrically isolated from one another;
wherein disposing the electrically-conductive material layer on the piezoelectric material layer comprises disposing a heavily doped polysilicon layer on the piezoelectric material layer.

21. A method of fabricating microelectromechanical system (MEMS) resonator, the method comprising:
disposing a piezoelectric material layer on a degenerately-doped single-crystal silicon layer;
disposing an electrically-conductive material layer on the piezoelectric material layer opposite the degenerately-doped single-crystal silicon layer; and
patterning the electrically-conductive material layer to form first and second electrodes that are electrically isolated from one another;
wherein the method further comprises offsetting a resonator axis along which the MEMS resonator exhibits a predominant motion during resonant oscillation from a dominant crystallographic axis of the degenerately-doped single-crystal silicon layer by an angle that substantially reduces at least one of first-order or second-order temperature coefficients of frequency (TCFs) of the MEMS resonator relative to first-and/or second-order TCFs that would result without angular offset between the resonator axis and the dominant crystallographic axis.

22. The method of claim 21 wherein disposing the piezoelectric material layer on the degenerately-doped single-crystal silicon layer comprises forming the piezoelectric material layer with a thickness that yields a predetermined thickness ratio between the piezoelectric material layer and degenerately-doped single-crystal silicon layer that attenuates at least one temperature coefficient of frequency of the MEMS resonator.

23. A method of fabricating microelectromechanical system (MEMS) resonator, the method comprising:
disposing a piezoelectric material layer on a degenerately-doped single-crystal silicon layer:
disposing an electrically-conductive material layer on the piezoelectric material layer opposite the degenerately-doped single-crystal silicon layer; and
patterning the electrically-conductive material layer to form first and second electrodes that are electrically isolated from one another;
wherein disposing the piezoelectric material layer on the degenerately-doped single-crystal silicon layer comprises disposing an aluminum nitride layer on the degenerately-doped single-crystal silicon layer.

24. The method of claim 23 wherein degenerately doping the single-crystal silicon substrate to form the degenerately-doped single-crystal silicon layer comprises doping the single-crystal silicon substrate with dopant in a manner that causes at least one of first-order or second-order temperature coefficients of frequency (TCFs) of the degenerately-doped single-crystal silicon layer and the piezoelectric material layer to be opposite in sign over at least part of an operating temperature range.

25. A method of fabricating microelectromechanical system (MEMS) resonator, the method comprising:
disposing a piezoelectric material layer on a degenerately-doped single-crystal silicon layer;
disposing an electrically-conductive material layer on the piezoelectric material layer opposite the degenerately-doped single-crystal silicon layer; and
patterning the electrically-conductive material layer to form first and second electrodes that are electrically isolated from one another;
wherein disposing the piezoelectric material layer on the degenerately-doped single-crystal silicon layer comprises forming the piezoelectric material layer with a thickness that yields a predetermined thickness ratio between the piezoelectric material layer and degenerately-doped single-crystal silicon layer that attenuates at least one temperature coefficient of frequency of the MEMS resonator.

* * * * *